US006499425B1

United States Patent
Sandhu et al.

(10) Patent No.: US 6,499,425 B1
(45) Date of Patent: Dec. 31, 2002

(54) QUASI-REMOTE PLASMA PROCESSING METHOD AND APPARATUS

(75) Inventors: Gurtej S. Sandhu, Boise, ID (US); Sujit Sharan, Boise, ID (US); Anand Srinivasan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/236,277

(22) Filed: Jan. 22, 1999

(51) Int. Cl.⁷ .............................................. C23C 16/509
(52) U.S. Cl. ............................... 118/723 E; 156/345.33; 156/345.34; 156/345.44
(58) Field of Search .................... 438/788, 308; 118/723 MP, 725, 728, 723, 719, 723 ER, 723 E, 723 ME, 715, 730; 156/643; 250/251; 204/298.08, 298.03, 298.11

(56) References Cited

U.S. PATENT DOCUMENTS

| | | | | |
|---|---|---|---|---|
| 4,209,357 A | * | 6/1980 | Gorin et al. ............... | 156/643 |
| 4,625,678 A | * | 12/1986 | Shioya et al. .............. | 118/723 |
| 4,792,378 A | * | 12/1988 | Rose et al. ................. | 438/706 |
| 4,883,686 A | | 11/1989 | Doehler et al. ............. | 427/38 |
| 4,951,603 A | * | 8/1990 | Yoshino et al. ............. | 118/719 |
| 5,010,842 A | * | 4/1991 | Oda et al. ............ | 118/723 ME |
| 5,093,149 A | | 3/1992 | Doehler et al. ............. | 427/38 |
| 5,126,033 A | * | 6/1992 | Szczyrbowski et al. ......... | 204/298.08 |
| 5,167,789 A | * | 12/1992 | Latz ....................... | 204/298.11 |
| 5,169,509 A | * | 12/1992 | Latz et al. ............... | 204/298.03 |
| 5,180,435 A | | 1/1993 | Markunas .................. | 118/723 |
| 5,252,131 A | * | 10/1993 | Kiyama et al. ............. | 118/719 |
| 5,292,370 A | * | 3/1994 | Tsai et al. .............. | 118/723 MP |
| 5,356,515 A | * | 10/1994 | Tahara et al. ............... | 156/643 |
| 5,429,070 A | | 7/1995 | Campbell .................... | 118/723 |
| 5,433,786 A | | 7/1995 | Hu .............................. | 118/723 |

(List continued on next page.)

FOREIGN PATENT DOCUMENTS

| | | | | | |
|---|---|---|---|---|---|
| JP | 357027033 A | * | 7/1980 | ........... | H01L/21/31 |
| JP | 5-152208 | * | 6/1993 | ......... | H01L/21/205 |
| JP | 6-151411 | * | 5/1994 | ........... | H01L/21/31 |

OTHER PUBLICATIONS

Nobuhiro Motegi et al, Long–throw low–pressure sputtering technology for very large–scale integrated devices, J. Vac. Sci. Tech. B13(4), Jul. 1995.*

Edelberg, Erik A., et al. "Energy Distribution of Ions Bombarding Biased Electrodes in High Density Plasma Reactors," J. Vac. Sci. Technol. A 17(2), Mar./Apr. 1999, pp. 506–516.

*Primary Examiner*—Gregory Mills
*Assistant Examiner*—Rudy Zervigon
(74) *Attorney, Agent, or Firm*—Leffert Jay & Polglaze P.A.

(57) ABSTRACT

In a plasma processing apparatus, a showerhead is provided that allows for selective ionization of one or more process gasses within the showerhead. The showerhead allows the gasses to react after they exit the showerhead. As a result, a greater volume of materials are. available for deposition on a wafer surface during a chemical vapor deposition process than would be available in a process that remotely generates plasma. In addition, less damage is done to the wafer that would be done in a process that generates plasma next to the wafer.

48 Claims, 17 Drawing Sheets

U.S. PATENT DOCUMENTS

| | | | |
|---|---|---|---|
| 5,453,124 A | * 9/1995 | Moslehi et al. | 118/715 |
| 5,464,499 A | 11/1995 | Moslehi | 216/71 |
| 5,468,955 A | * 11/1995 | Chen et al. | 250/251 |
| 5,480,678 A | * 1/1996 | Rudolph et al. | 427/248.1 |
| 5,567,243 A | * 10/1996 | Foster et al. | 118/730 |
| 5,595,606 A | * 1/1997 | Fujikawa et al. | 118/725 |
| 5,614,026 A | 3/1997 | Williams | 118/723 |
| 5,616,518 A | 4/1997 | Foo | 438/680 |
| 5,624,498 A | 4/1997 | Lee | 118/715 |
| 5,628,829 A | 5/1997 | Foster | 118/723 |
| 5,637,180 A | * 6/1997 | Gosain et al. | 156/345 |
| 5,676,758 A | 10/1997 | Hasegawa | 118/173 |
| 5,803,973 A | * 9/1998 | Szczyrbowski et al. | 118/723 ER |
| 5,846,332 A | * 12/1998 | Zhao et al. | 118/728 |
| 5,846,883 A | * 12/1998 | Moslehi et al. | 438/711 |
| 5,937,304 A | * 8/1999 | Yoshinouchi et al. | 438/308 |
| 5,976,992 A | * 11/1999 | Ui et al. | 438/788 |
| 6,086,677 A | * 7/2000 | Umotoy et al. | 118/715 |
| 6,089,472 A | * 7/2000 | Carter | 239/422 |

* cited by examiner

QUASI-REMOTE PLASMA PROCESSING METHOD AND APPARATUS

TECHNICAL FIELD

The present invention relates generally to a plasma processing apparatus and a method of performing various plasma processes. More specifically, the present invention concerns depositing a thin film of material on an object, such as a semiconductor wafer, through a plasma enhanced chemical vapor deposition process.

BACKGROUND OF THE INVENTION

In the formation of integrated circuits, thin films of material are often deposited on the surface of a substrate, such as a semiconductor wafer. These thin films may be deposited to provide conductive and ohmic contacts in the circuits and between various devices of those circuits. For example, a thin film might be applied to the exposed surface of a contact or via hole on a semiconductor wafer, with the film passing between the insulative layers on the wafer. This would provide plugs of conductive material and allow interconnections across insulating layers. Those skilled in the art are aware of additional reasons for applying thin films on an object.

One well known process for depositing thin metal films is chemical vapor deposition (CVD). In this process, deposition occurs as a result of chemical reactions between various gasses. These gasses are pumped into a chamber that contains the wafer. The gasses subsequently react, and one or more of the reaction by-products form a film on the wafer. Any by-products that remain after the deposition are removed from the chamber. Films deposited by CVD tend to exhibit good step coverage. Step coverage indicates the ability of a material to consistently cover an underlying topography. For example, if a film is deposited onto a surface and into a trench recessed in that surface, it would be ideal if the thickness of the film on the surface was the same as the film thickness on the bottom and sides of the trench. In general, if the film thickness at the bottom of the trench is at least 50% of the thickness at the top of the trench, the step coverage is considered to be good. One of ordinary skill in the art can appreciate however, that the 50% benchmark is merely a general guideline and that specific benchmarks depend on the particular chemistry used for deposition. Traditional CVD processes often result in a step coverage of at least 50%. However, while CVD is useful in depositing films, many of the traditional CVD processes are thermal processes requiring high temperatures in order to obtain the necessary reactions. These high temperatures may adversely affect the devices comprising the integrated circuit.

One way to lower the reaction temperature is to ionize one or more of the component gasses used in the CVD process. Such a technique is generally referred to as plasma enhanced CVD (PECVD). Prior art teaches ionizing the gas in one of two places differentiated by their proximity to the chamber. One option is to ionize the gas locally—creating a plasma within the chamber immediately above the wafer. This can be accomplished by providing electrodes within the chamber. Based on the frequency and power generated by the electrodes, an electric field is generated right over the wafer that ionizes the gasses and attracts the plasma to the wafer surface. The gas is introduced into the chamber through a "showerhead"—a receptacle that defines a volume, receives a process gas into that volume, and allows the gas to disperse through a porous portion, such as a wall defining a plurality of perforations. In doing so, the showerhead serves to distribute the gas throughout the chamber in a more even distribution than would occur if the gas simply entered the chamber through a single hole. Oftentimes, the showerhead itself acts as one electrode, and the wafer support surface—also known as the susceptor—serves as another electrode. Accordingly, the showerhead can be coupled to a radio frequency (RF) power source (or other power source) and the susceptor can be grounded. Conversely, the showerhead may be grounded while RF power is applied to the susceptor. Regardless of what components serve as electrodes, the resulting RF field induces a glow discharge, which transfers energy to the reactant gasses that have been introduced into the chamber. As a result, free electrons are created within the discharge region. These free electrons gain sufficient energy from the RF field so that when they collide with gas molecules, gas phase dissociation and ionization of the reactant gasses occurs. Energetic species, or free radicals, diffuse out of the plasma and are then absorbed onto the wafer. However, an unfortunate side effect of generating the plasma between the showerhead and the wafer is that heavy ions from the plasma, having an energy of up to 1.5 KeV per ion, impact the wafer and cause physical damage to the structures on the wafer. Moreover, the electrons freed by the RF field may also impact the wafer and alter the electrical properties of certain materials on the wafer, such as a gate oxide.

Another option that avoids this potential damage is to generate the plasma remotely—away from the chamber. As demonstrated in U.S. Pat. No. 5,624,498, by Lee, et al., a plasma can be created by ionizing a gas used in the deposition process at a location removed from the chamber. The plasma is then passed through a conduit and is introduced into the chamber through the showerhead. Other gasses, whether they are ionized or not, enter the chamber from another entrance. Once inside the process area, the gasses interact with each other and, hopefully, produce the by-products needed to form the thin film on the wafer. Because the particles constituting the plasma lose their energy over time, generating the plasma a suitable distance away from the chamber results in the deposition materials impacting the wafer surface with less energy than deposition materials diffusing from locally generated plasma. Thus, there is less physical damage done to the wafer. In addition, the electrons recombine with ions and therefore create fewer changes in the electrical properties of the wafer. However, during the time taken to reach the chamber, the free radicals needed to deposit onto the wafer also stabilize, thereby slowing the deposition process. As a result, step coverage is poor and either the required deposition time is increased or the amount of gasses used must be increased.

Given these limitations, there is a need in the art for a plasma processing method that provides deposition superior to that of remote plasma-generation systems yet avoids the wafer damage caused by local plasma-generation systems.

SUMMARY OF THE INVENTION

Accordingly, the present invention provides a plasma-generation area for a plasma-processing system, wherein said area is located intermediate the conventional remote and local plasma-generating locales employed in the prior art. One exemplary embodiment of the present invention places this intermediate plasma generation area within a shell or volume defined by a showerhead located in the process area. Within the showerhead of this embodiment, a selection of gasses are ionized. Materials to be deposited are formed outside of the showerhead. This embodiment has the advantage of allowing the activated gas molecules to reach the substrate without the recombination that occurs in remote systems. The deposition materials will also be more uniformly distributed, which will allow for a more uniform film on the substrate. This and other exemplary embodiments also have the advantage of avoiding the damage caused by local plasma-generation systems. The present invention also comprises methods for achieving these advantages.

DETAILED DESCRIPTION OF THE PREFERRED EMBODIMENTS

Figure 1:
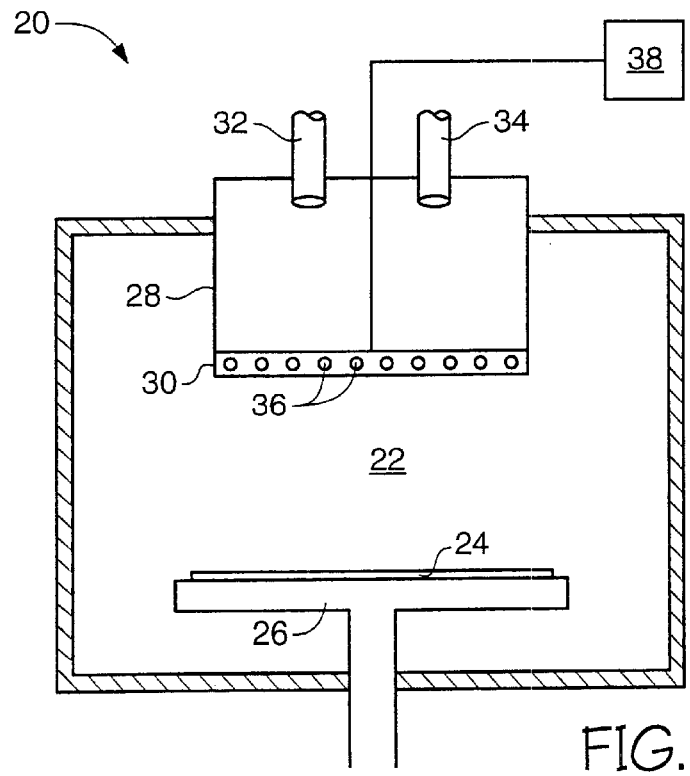
FIG. 1 depicts a cross-sectional view of a CVD reactor as found in the prior art.

FIG. 1 is an example of a PECVD device using a local-generation plasma process as found in the prior art. Specifically, FIG. 1 is a simplified version of a CVD reactor disclosed in U.S. Pat. No. 5,567,243 by Foster, et al. Foster's CVD reactor 20 defines a process area 22 wherein suitable materials are available for deposition upon a surface such as a wafer 24, although one skilled in the art will appreciate that other surfaces may benefit from the deposition of material. These surfaces include semiconductor substrates in general and, in particular, surfaces created by silicon-on-insulator technology or formed by a spin-on-glass process. For purposes of explaining the current invention, however, it is assumed that a standard semiconductor wafer 24 is being processed. The wafer 24 is supported by a susceptor 26 extending into the process area 22. Also extending into process area 22 is a cylinder 28. The end of the cylinder 28 closest to the wafer 24 is coupled to a showerhead face plate 30. The other end of the cylinder 28 receives process gasses (not shown) from various gas conduits 32, 34. The gasses travel through cylinder 28 and are dispersed throughout the remaining process area 22 by the holes or apertures. 36 of the showerhead face plate 30. Further, showerhead face plate 30 is connected to an RF power source 38, which electrically biases the showerhead face plate 30. In operation, the gasses are ionized by the RF field generated by the showerhead face plate 30 into a plasma form once they exit the showerhead face plate 30. Significantly, Foster '243 emphasizes that the showerhead face plate 30 is intentionally designed to prevent plasma from forming "above" the showerhead face plate 30—within the cylinder 28.: (Foster '243 col. 13, ln. 15.) Foster '243 further teaches toward preventing plasma from appearing at the showerhead face plate level within the apertures 36. (Foster '243 col. 13 ln. 12–13.) Foster '243 teaches forming plasma exclusively in the area in between the showerhead face plate 30 and the wafer 24. The result is a concentrated plasma near the surface of the wafer 24, which risks the wafer damage described above.

Figure 2:
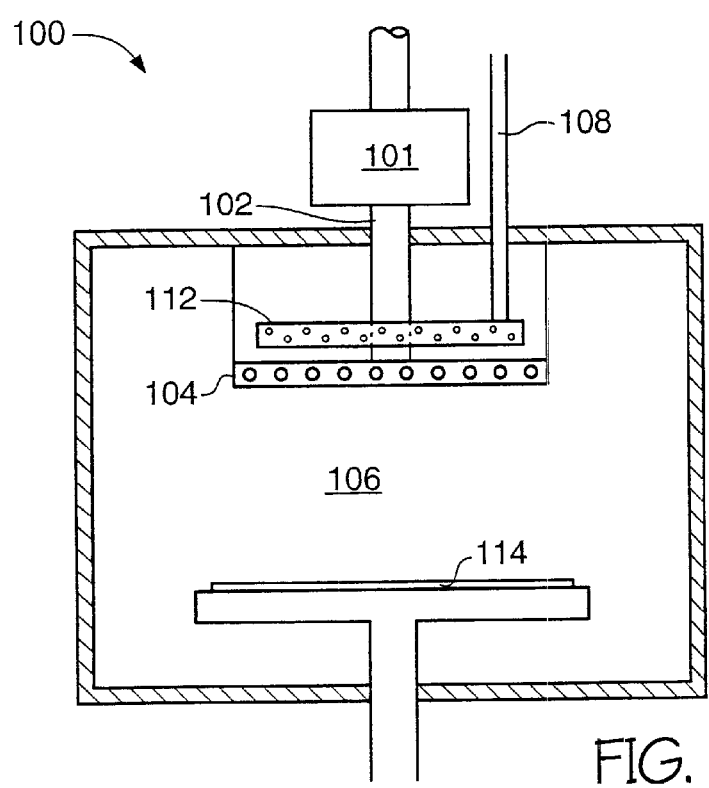
FIG. 2 depicts a cross-sectional view of another CVD reactor as found in the prior art.

Alternatively, Foster '243 discloses a CVD reactor 100 using a remote-generation plasma process, seen in simplified version in FIG. 2. One gas is ionized in a region 101 away from process area 106 and subsequently travels through a conduit 102 before reaching the showerhead face plate 104. Other un-ionized gasses travel to the process area 106 through another conduit 108. Conduit 108 leads to a dispersion ring 112, where the un-ionized gasses subsequently travel to the showerhead face plate 104 and ultimately to the process area 1.06. However, remotely generating the plasma results in other disadvantages discussed above. It is also noteworthy that Foster '243 presents only two options for locations of plasma generation—either local (immediately next to the wafer 114) or remote (outside of the process chamber containing the wafer, specifically described as "upstream" plasma generation in the text of Foster '243).

Figure 3:
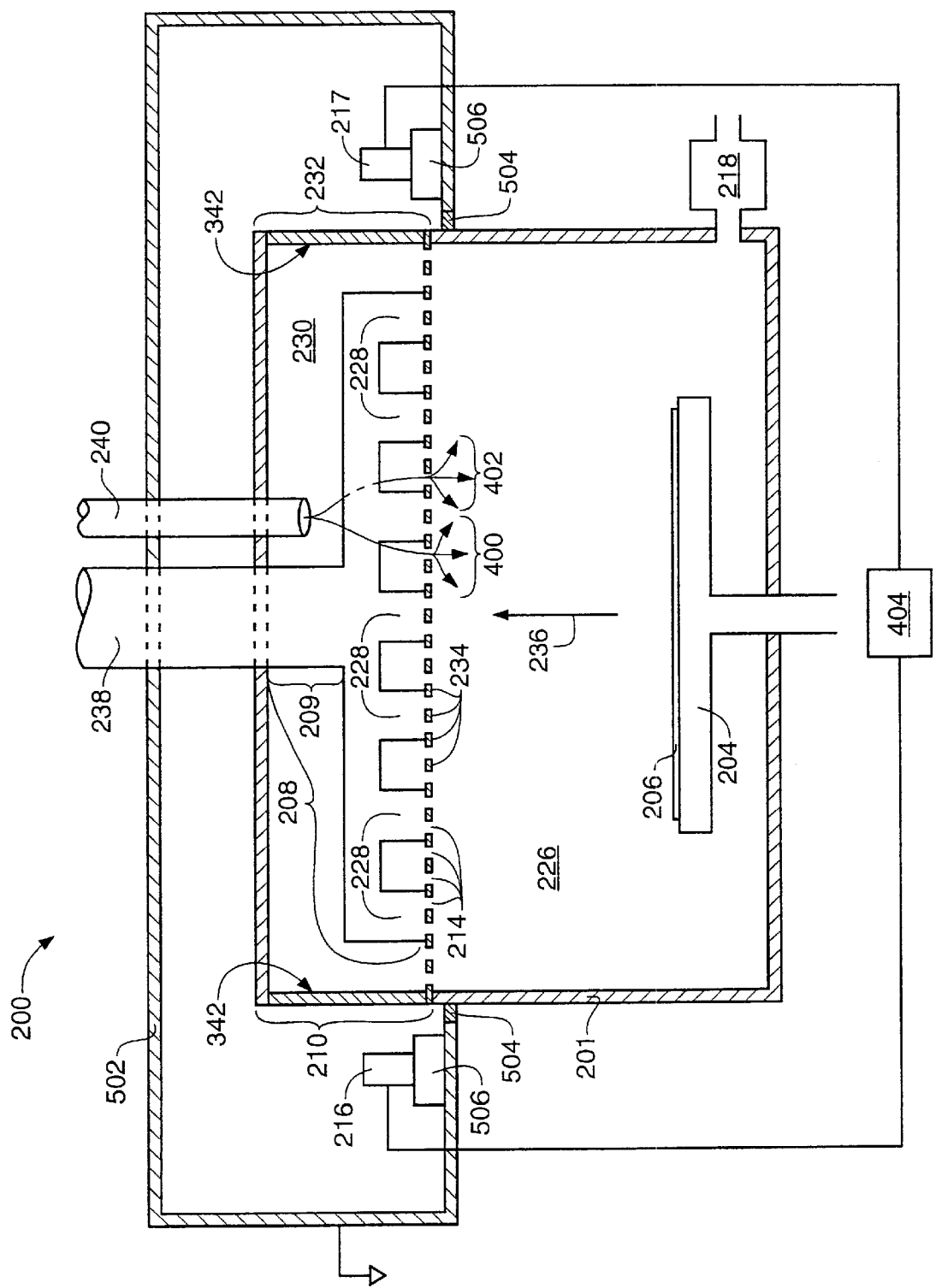
FIG. 3 depicts a cross-sectional view of one exemplary embodiment of the current invention.

Embodiments of the current invention provide a new option: generating the plasma in an intermediate position relative to the local and remote locations described above. The plasma processing apparatus 200, as seen in FIG. 3, comprises a housing 201 which partially defines a chamber 226 in which various plasma processes described below can take place. The plasma-processing apparatus 200 further comprises a susceptor 204 extending into the chamber 226 from the bottom of the housing 201. The susceptor 204 is capable of supporting a wafer 206. A first supply pipe 238 delivers a first gas or a first group of gasses, which may be un-ionized, to a gas conduit 208. The first gas conduit 208 is part of a showerhead 210, which is coupled to the housing 201 and further defines the chamber 226. A second supply pipe 240 delivers a second gas or second group of gasses to the showerhead 210. The showerhead 210 further comprises a shell or body 232, configured to temporarily house the gas before dispersal and includes a face plate 234 having apertures 214. The face plate 234 could be a separate component coupled to the body 232. Alternatively, the showerhead 210 could be considered to comprise one continuous structure from element 234 to the body 232. The showerhead 210 depicted in the figures of this application may be construed to be of either configuration.

Figure 4:
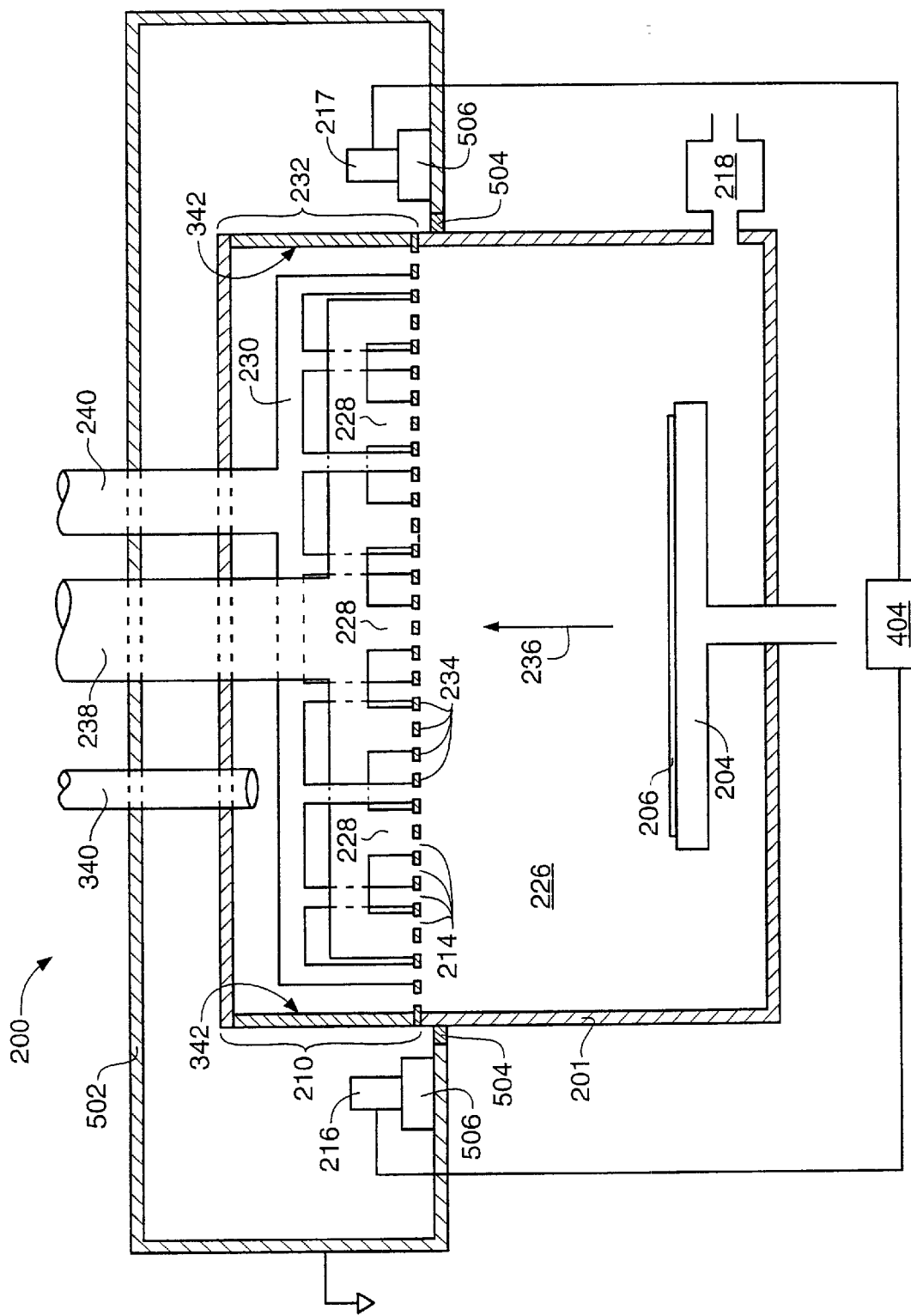
FIG. 4 depicts a cross-sectional view of a second exemplary embodiment of the current invention.

The first and second gas (or the first group of gasses and the second group of gasses) are kept apart until they are outside of the showerhead 210. This is accomplished in this embodiment by partitioning the gasses entering the showerhead 210. Specifically, the passage of the first gas through the showerhead is limited to the confines of the gas conduit 208. The gas conduit 208 is configured to branch out from a main trunk 209 to a plurality of sub-conduits 228;that lead to some of the apertures 214 of the showerhead 210. The second supply pipe 240 may lead to an interior passageway 230 of the showerhead 210. In this embodiment, the passageway .230 is simply defined by the space between the body 232 and the gas conduit 208. However, the current invention also covers embodiments, such as the one shown in FIG. 4, wherein the passageway 230 for the second gas is also confined to a conduit system. In FIG. 4, portions of passageway 230 that are obscured by gas conduit 208 are indicated by dashed lines. In this way a third gas could be introduced into the showerhead through a third supply pipe 340 and kept separate from the other two gasses. It follows that the current invention covers embodiments using even more conduit systems.

Returning to the embodiment in FIG. 3, the second gas flows through the passageway 230, generally following paths such as those indicated by the arrows 400 and 402. Once again, obscured flows are indicated by dashed lines. Ultimately, the second gas flows out of the apertures 214 that are not blocked by the gas conduit 208. The wall or walls 342 defining the perimeter of the showerhead 210 can be external to the housing 201. In the FIG. 3 embodiment, for example, the wall 342 is above, commensurate with, and coupled to the side of the housing 201. As for preferred materials, wall 342 can be made of an insulative material, such as quartz or aluminum oxide (or other ceramics). These types of material allow the transmission of energy through the perimeter 342 and allow external power sources to inductively affect the gasses traveling through the showerhead 210, as discussed below.

FIG. 3 also illustrates a pair of ionization electrodes 216 and 217 that are configured to couple to a power source 404. These electrodes 216 and 217 are cooperatively positioned relative to the showerhead 210 such that ionization of selected gasses occurs while they are still within the interior of the showerhead 210. This positioning is due in part to the placement of electrodes 216 and 217 within a covering or casing 502 which is preferably made primarily of metal and is grounded. It is also preferable that the part of the casing 502 contacting the showerhead 210 or the housing 201 comprise an insulating material 504. If needed, insulating material 506 may also be provided between one or all of the electrodes 216 and 217 and the metal of the casing 502.

Figure 5A:
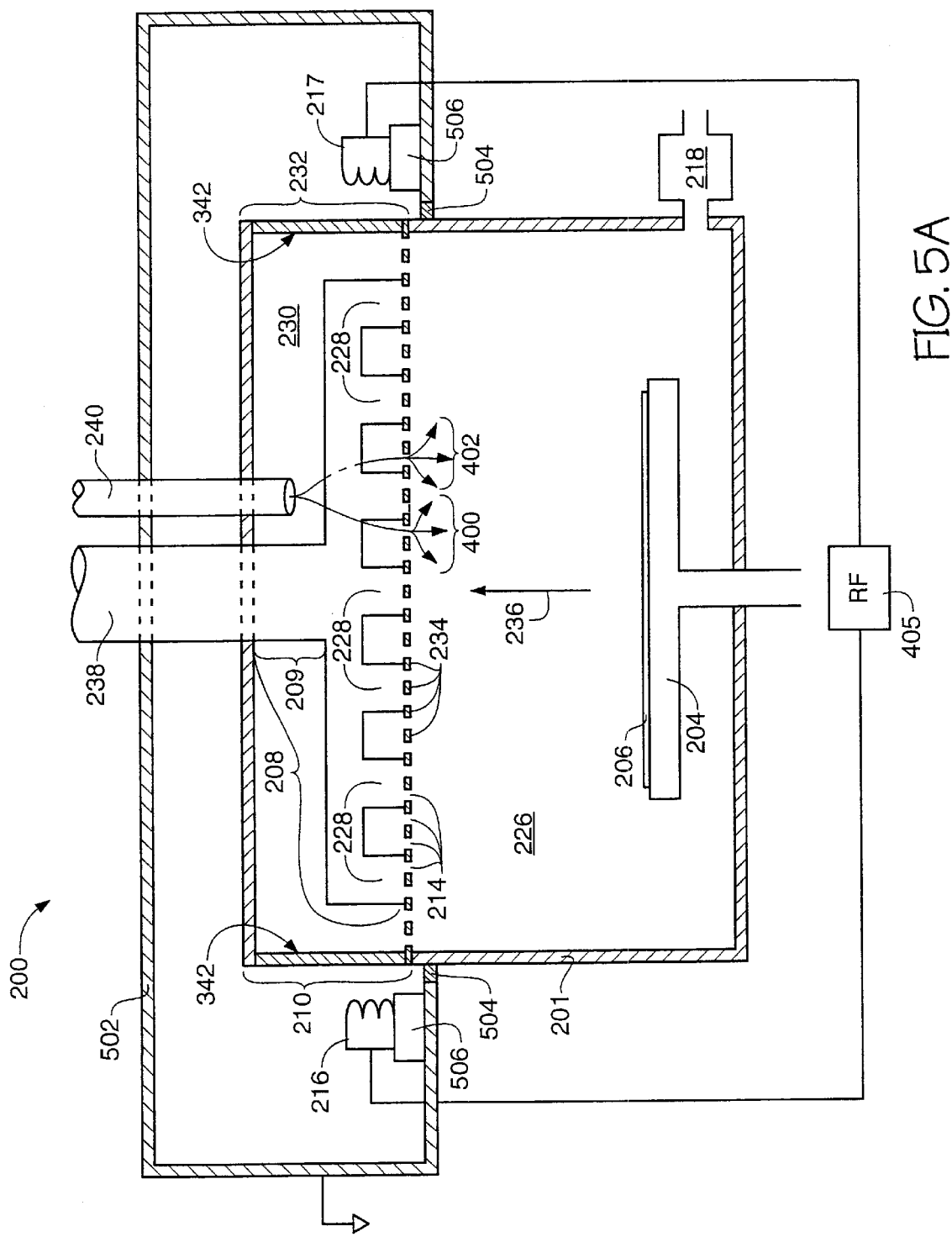
FIG. 5A depicts a cross-sectional view of a third exemplary embodiment of the current invention.

In one embodiment, illustrated in FIG. 5A, the ionization electrodes 216 and 217 are coupled to an RF power source 405 and are generally level with the showerhead 210. The induced gas ionization in this embodiment is a function of the type of gas, the pressure of the gas, whether the gas is mixed with another gas, and the magnitude of power provided by the RF power source 405. As a result, these parameters are cooperatively adjusted so that at least one of the supplied gasses forms a plasma. For purposes of explanation, it is assumed that the power and pressure parameters are adjusted to specifically ionize the gas within the gas conduit 208. Thus, it is desirable to ionize the gas only in the sub-conduit portions 228 of the gas conduit 208. This can be accomplished by making the sub-conduits 228 narrower than the main trunk 209, thereby increasing the pressure in the sub-conduits 228 to the point necessary to induce ionization.

Given the partitioned configuration of the showerhead 210, the second gas flows around the exterior of gas conduit 208, as indicated by arrows 400 and 402, and exits the showerhead 210 in an un-ionized state. Alternatively, the gas type, mix, pressure, and ionizing power may be sufficient to ionize the second gas as well. There is no limit to the number of gasses that can be ionized, so long as deposition materials are not formed within the showerhead. This can be accomplished by partitioning the relevant gasses within the showerhead.

Outside of the showerhead 210, the activated atoms of the first gas reactively form deposition materials by combining with the second gas. As a result of the quasi-remote generation of plasma, the reactive species are formed in a quantity sufficient for high and uniform deposition rates. Moreover, because (1) there is no plasma immediately above the wafer, and (2) the active species have a relatively low energy (preferably less than 1 KeV per atom and more preferably around 100 eV per atom), there is less damage done to the wafer 206. A pump 218 is used to draw away the gasses from the process area 202.

As a specific example of the embodiment of FIG. 5A in operation, it is assumed that it is desired to deposit a layer of titanium nitride (TiN) on the surface of the wafer 206. To accomplish this, ammonia ($NH_3$) and a carrier gas such as Argon (Ar) are passed through the gas conduit 208. The main trunk 209 is assumed to have a diameter of generally 0.25 inches, whereas the sub-conduits 228 have a diameter of around 500 mills (1 mil=0.001 inches). (It should also be noted that, in this figure as well as others, the dimensions are not necessarily to scale; rather, they are proportioned to better illustrate the embodiments of the invention.) Thus, for example, when the flow rate through the main trunk 209 is anywhere from 5 to 300 sccm and electrodes are generating a 1000 W RF field at 13.56 MHz, a plasma is formed within the sub-conduits 228 wherein the $NH_3$ gas provides, among other things, free electrons, ions, and charge neutral N* and H* radicals. Further, one of ordinary skill in the art knows the relationship between gas pressure and RF settings concerning ionizing gasses and that the parameters for doing so can be adjusted accordingly in order to generate plasma. Meanwhile, tetrakisdimethyl-aminotitanium ($Ti(N(CH_3)_2)_4$, or TDMAT) is passed through passageway 230. If the pressure of TDMAT and the power and wavelength of the RF field are properly matched, the TDMAT gas will also ionize. Once the gasses exit the showerhead 210 through the apertures 214, the TDMAT reacts with the N* and H* radicals in the presence of Argon to form the titanium nitride deposition material. The step coverage achieved under the methods and apparatus depends, of course, upon the aspect ratio of the topography. Assuming a 6:1 aspect ratio, the current invention results in step coverage of generally eighty to ninety percent, as compared to standard thermal CVD processes, which yield a step coverage of about seventy to eighty percent.

Moreover, there are other methods of depositing a TiN film using other gasses. Those methods and the appropriate parameters can be found in references such as U.S. Pat. No. 5,628,829 (Foster et al.)

As another example, titanium tetrachloride ($TiCl_4$) can be reacted with $H_2$ in the presence of Ar to form a titanium film on the wafer. In this case, The $H_2$ and Ar are passed through. the gas conduit 208, where the flow rate of $H_2$ ranges from approximately 20–2000 sccm and the flow rate of Ar ranges from about 300–1000 sccm. Further, the diameters of the sub-conduits 228 are sufficient to create plasma within the sub-conduits 228 in the presence of an RF field having a power ranging from 100 to 600 W and a frequency of 60 or 13.56 MHz. Alternatively, as known in the art, if the $Ar/H_2$ pressure were increased, then the RF field could have a lower power. Under these and similar parameters, a hydrogen plasma will be formed that includes free electrons, H+ions, and charge neutral activated hydrogen radicals H*. Meanwhile, $TiCl_4$ is passed through passageway 230. After dispersal from the showerhead, the gasses react to form titanium on the wafer and HCl, which is removed through the use of pump 218. In general, providing a Ti layer through PECVD processing of these gasses involves the gas flow rate and RF settings described above, as well as other parameters such as a substrate temperature of 400–600° C.; and an ambient pressure of 0.1 to 10 torr. Nevertheless, prior art discloses parameters exceeding these in certain circumstances. See, for example, U.S. Pat. No. 5,676,758 (Hasegawa et al.) and U.S. Pat. No. 5,567,243 (Foster et al.).

In the embodiments pictured, the showerhead 210 and the susceptor 204 are arranged in a cooperative manner to aid in uniform deposition. This cooperation is accomplished by placing the susceptor 204 across the chamber 226 from the showerhead 210, wherein the face plate 234 of the showerhead 210 and the susceptor 204 define planes that are generally parallel to each other (and, incidentally, parallel to the bottom of the housing 201). Further, the showerhead 210 and susceptor 204 are generally aligned along an axis 236 that runs through the center of the susceptor 204 and is perpendicular to the planes described above. One of ordinary skill in the art is aware of other ways to achieve cooperation between a showerhead and a susceptor, and the present invention covers those alternatives.

Figure 5B:
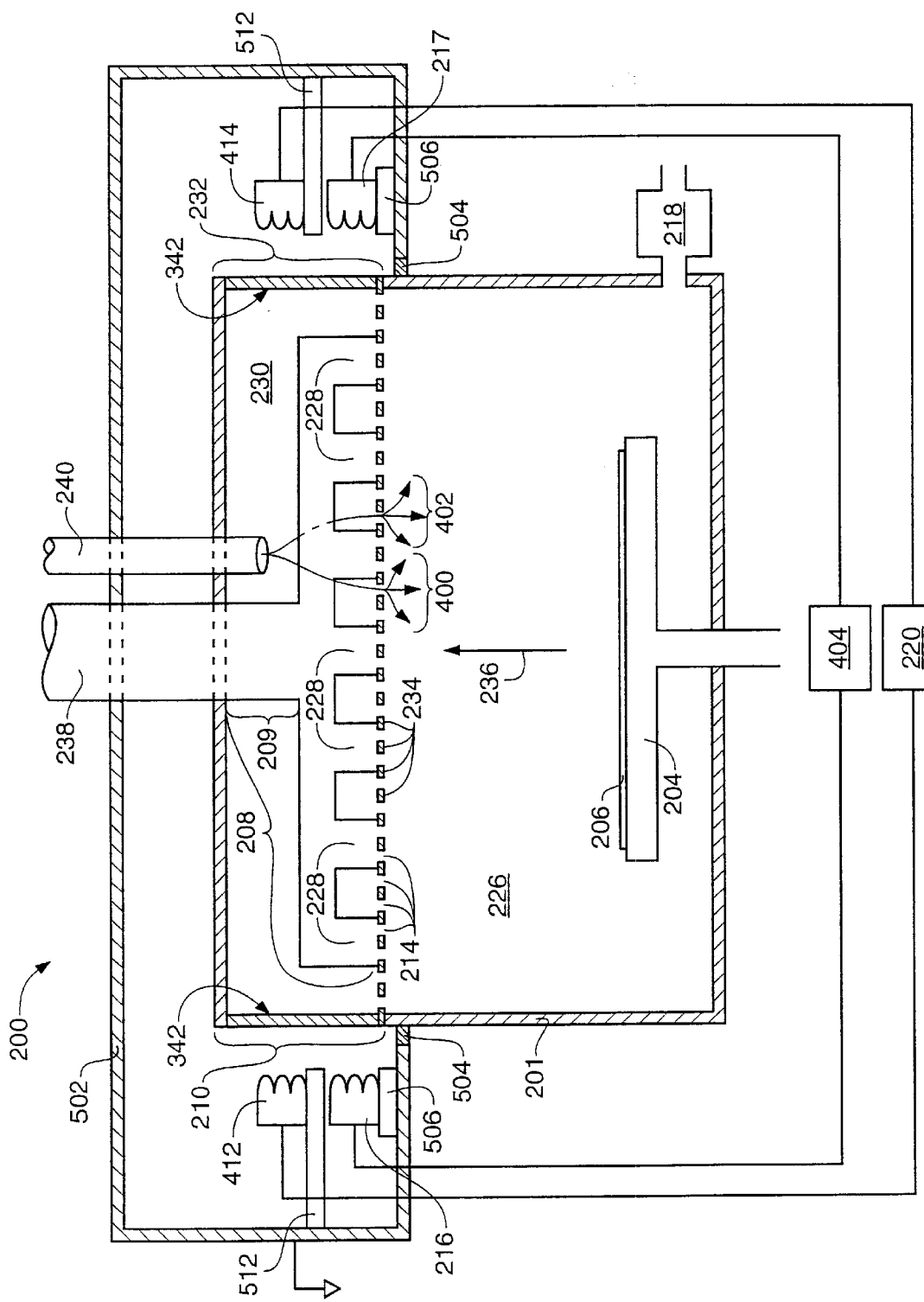
FIG. 5B depicts a cross-sectional view of a fourth exemplary embodiment of the current invention.
Figure 5C:
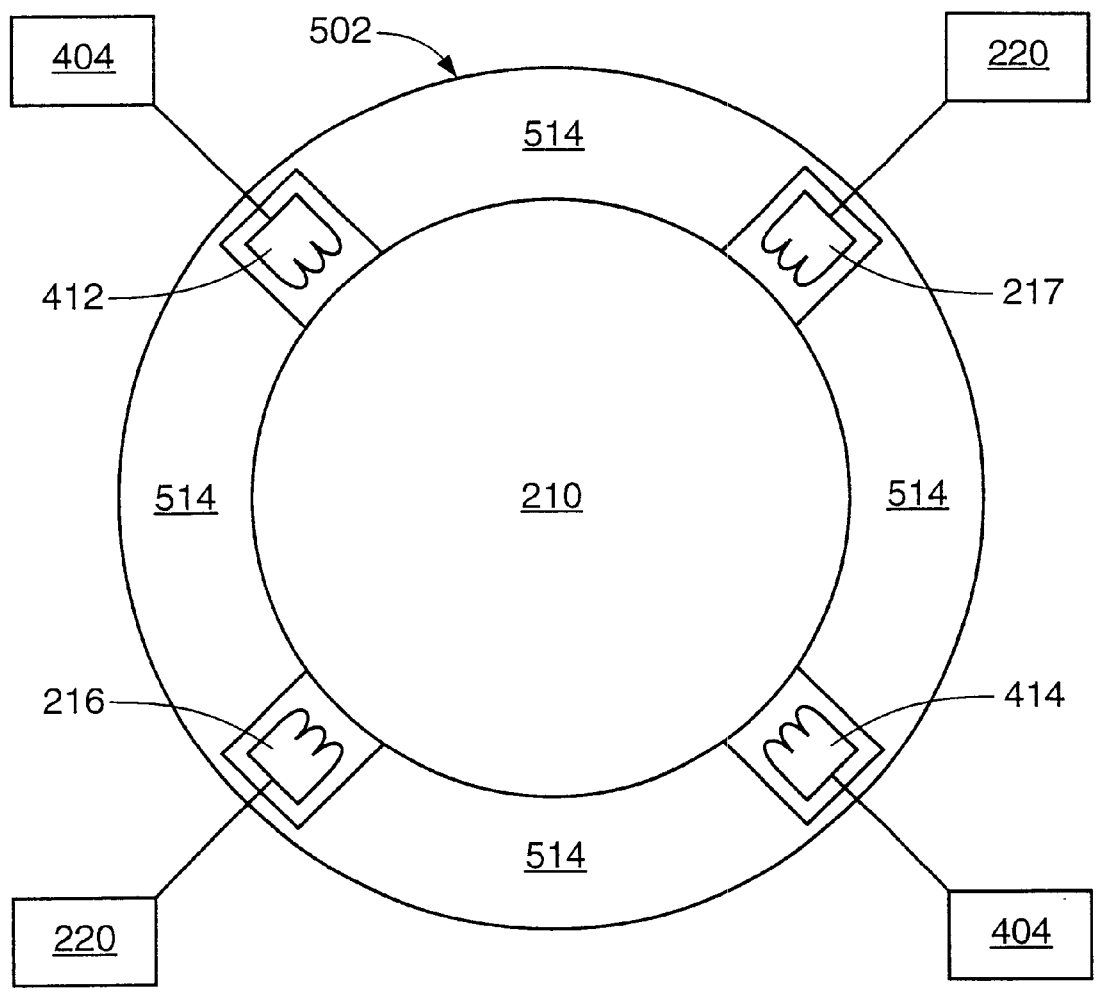
FIG. 5C depicts a top-down view of a fifth exemplary embodiment of the current invention.

As mentioned above, the current invention is not limited to ionizing one gas or group of gasses. The second gas could be diluted with another gas or pressurized to the degree necessary to cause ionization given the RF power applied by the RF power source 404 in FIG. 5A. Alternatively, as shown in the exemplary embodiment depicted in FIG. 5B, a second pair of electrodes 412 and 414 can be coupled to a second RF power source 220 in order to selectively ionize the second gas under the proper power and pressure settings. It should be noted in FIG. 5B that, within the casing 502, a divider 512 provides support for the second pair of electrodes (412 and 414) as well as insulation from the other pair of electrodes (216 and 217) and from the metal of the casing 502. Moreover, while FIG. 5B shows the second pair of electrodes 412 and 414 stacked over the other pair of electrodes 216 and 217, an alternate embodiment appears in FIG. 5C. In the top-down view of that figure, the electrodes 216, 217, 412, and 414 are spread generally equidistantly around the perimeter of the showerhead 210, with insulation 514 protecting the electrodes from each other and from the metal of the casing 502.

It follows that embodiments of the current invention cover plasma processing apparatuses receiving additional gas conduits and having showerheads with multiple selective-activation zones, wherein the zones coincide with the gasses in one or more of the conduits and are generated by the various electrodes.

Further, RF power sources are not the only power sources covered under the current invention for initiating plasma formation; any type of electromagnetic energy may be used to ionize at least one of the gasses. Thus, power source 404 could be a microwave energy source, generating an ionizing field through electron cyclotron resonance (ECR) equipment or through the use of a helical resonator. Details for plasma processes using microwave energy can be found in U.S. Pat. No. 5,616,518 (Foo et al.).

Figure 6:
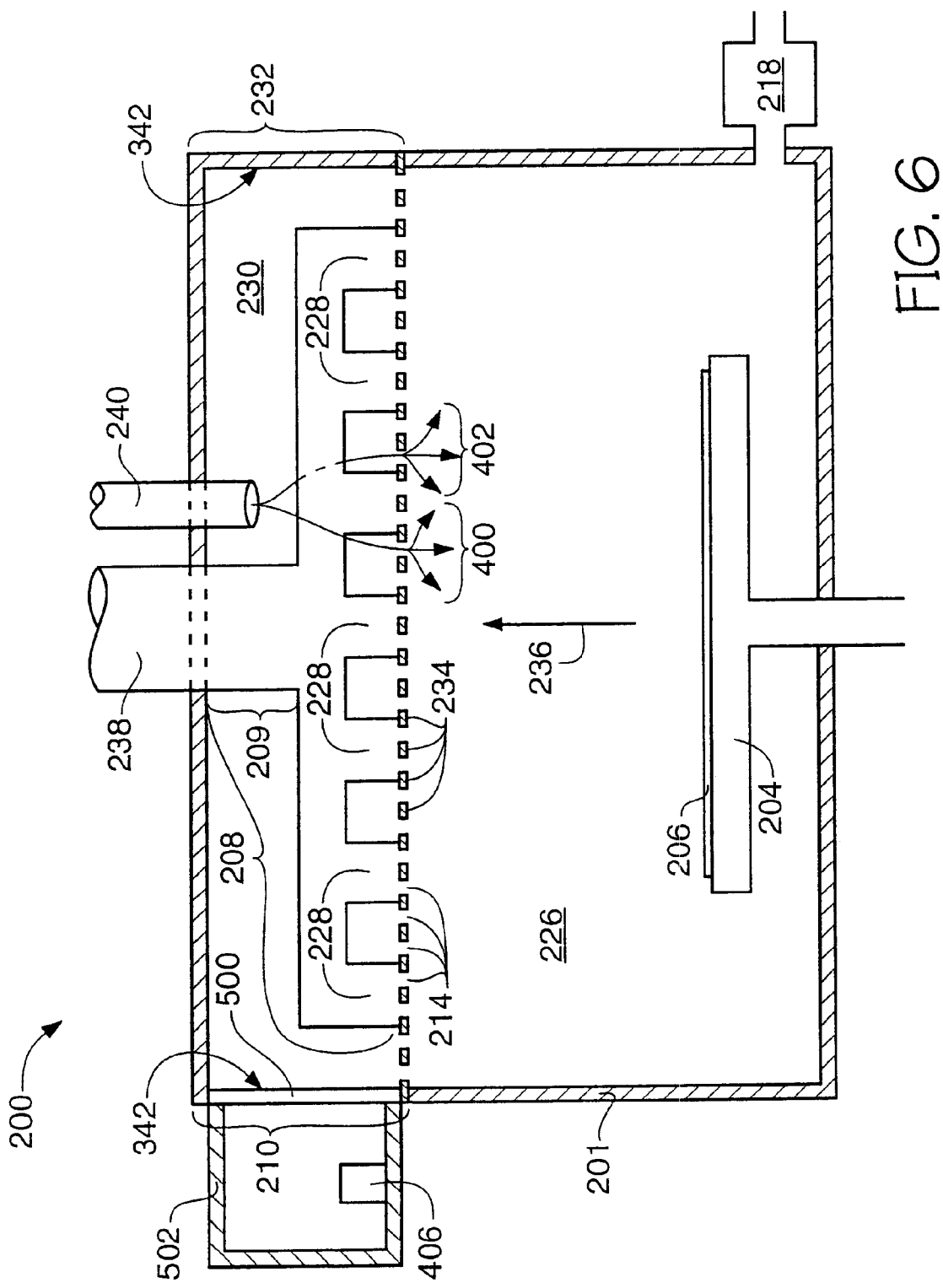
FIG. 6 depicts a cross-sectional view of a sixth exemplary embodiment of the current invention.

As seen in FIG. 6, it is also possible to replace the electrodes 216 and 217 with a device 406 that sends photonic energy through a window 500 into the showerhead 210 to create the plasma. The photons may have optical or ultraviolet wavelengths. Any photon source that generates these wavelengths can be employed. Such sources include excimer lasers, preferably those of the inert halide class. Examples of inert halides used in lasers include XeCl, ArF, KrF, and XeF, which generate wavelengths of 308 nm, 193 nm, 248 nm, and 351 nm, respectively. Ultraviolet lamps can also serve as the photon-generating device 406. An ArF lamp, for example, will generate the same 193 nm wavelength as the ArF laser. Of the two choices, the laser is the preferred photon generating device 406, as it is capable of providing greater energy. If selective ionization within the showerhead 210 is desired, the conduit 208 inside the showerhead 210 can be made of a material opaque to the photonic energy such as a high quality quartz, although this is not a necessary requirement for the: invention so long as gasses that combine to form a deposition material are kept separate while they are inside the showerhead 210. The embodiment in FIG. 6 is also noteworthy in that it demonstrates an instance in which there is no insulation 504 or 506 and where the casing 502 is coupled to the showerhead 210 rather than to the housing 201.

Figure 7:
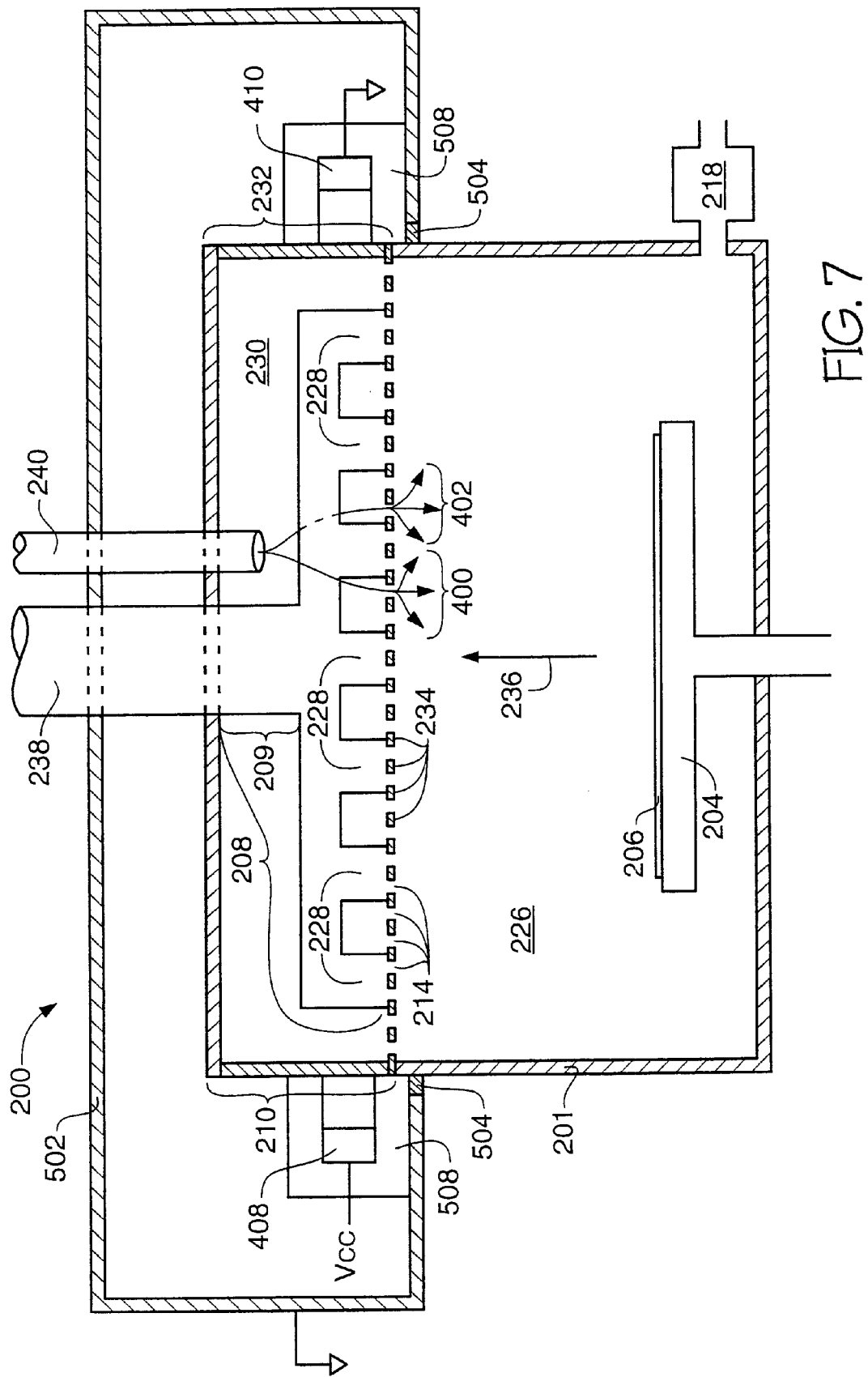
FIG. 7 depicts a cross-sectional view of a seventh exemplary embodiment of the current invention.
Figure 8:
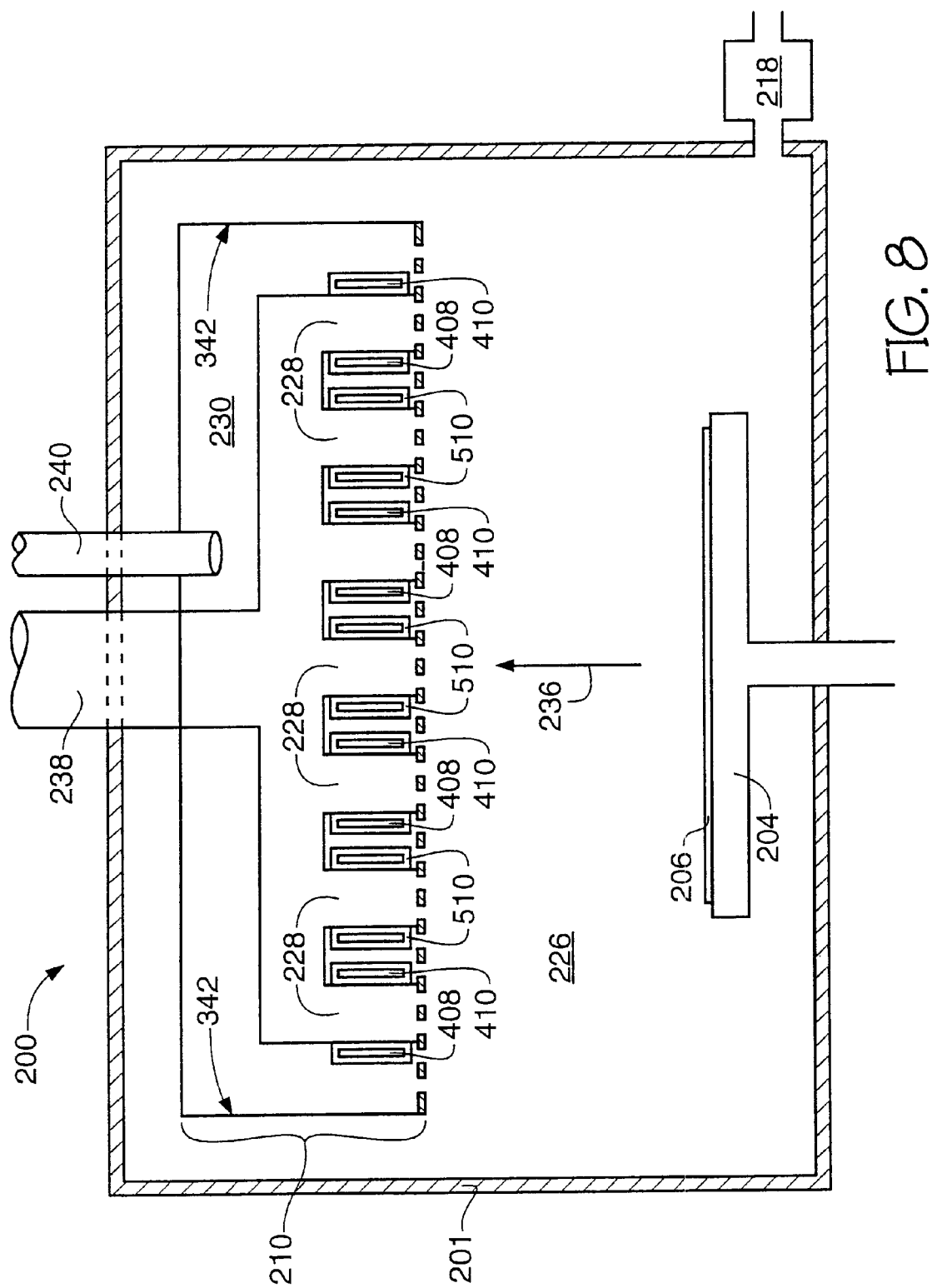
FIG. 8 depicts a cross-sectional view of an eighth exemplary embodiment of the current invention.

As another option, electrostatic energy can be used to generate plasma by electrically coupling a DC bias to a region within the showerhead 210. As shown in FIG. 7, two DC plates 408 and 410, one (408) coupled to a voltage source $V_{cc}$, the other (410) coupled to ground, are placed across the showerhead 210 and electrically isolated from metal surfaces with insulation 508. The resulting DC bias between the two plates serves to ionize gasses within the showerhead. Oftentimes a potential ranging from 25 to 1000 volts is sufficient to ionize the gas, the exact voltage required depending on the pressure of the gas. However, the voltage established may be 5000 v or higher, depending upon the application. In an alternative embodiment seen in FIG. 8, pairs of DC plates 408 and 410 could be placed across each sub-conduit 228 and used to generate DC biases across each sub-conduit 228. Each plate 408 or 410 would be held in place by insulating material 510.

Figure 9:
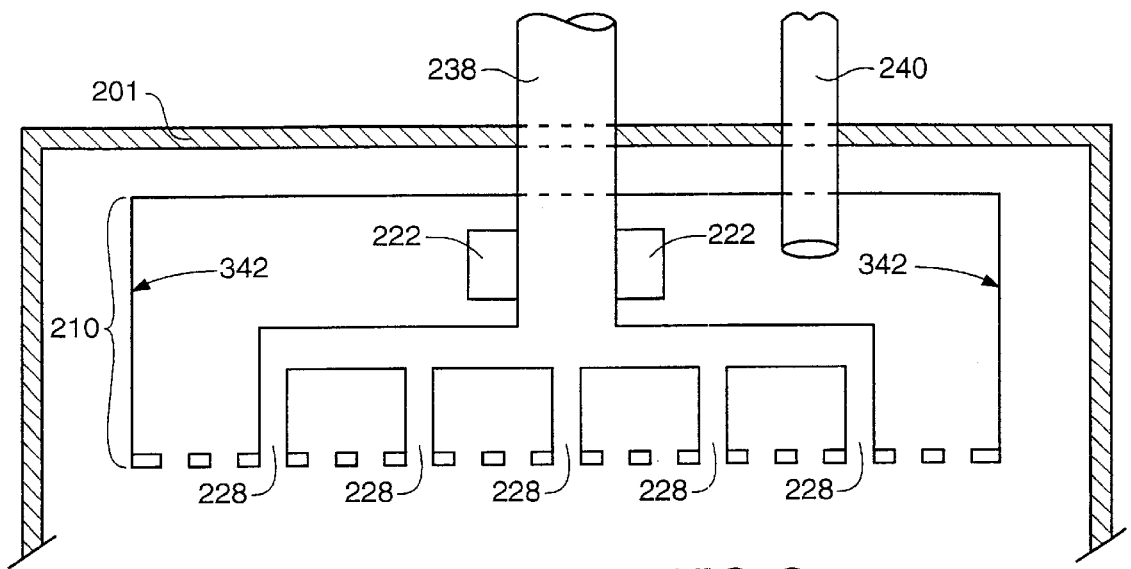
FIG. 9 depicts a cross-sectional view of a ninth exemplary embodiment of the current invention.
Figure 10:
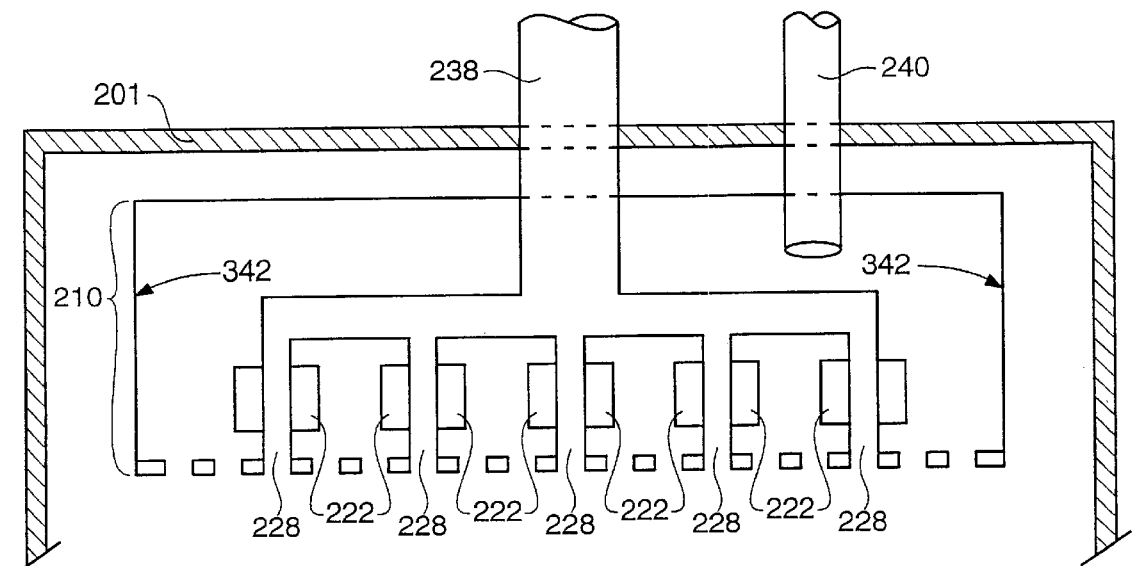
FIG. 10 depicts a cross-sectional view of a tenth exemplary embodiment of the current invention.
Figure 11:
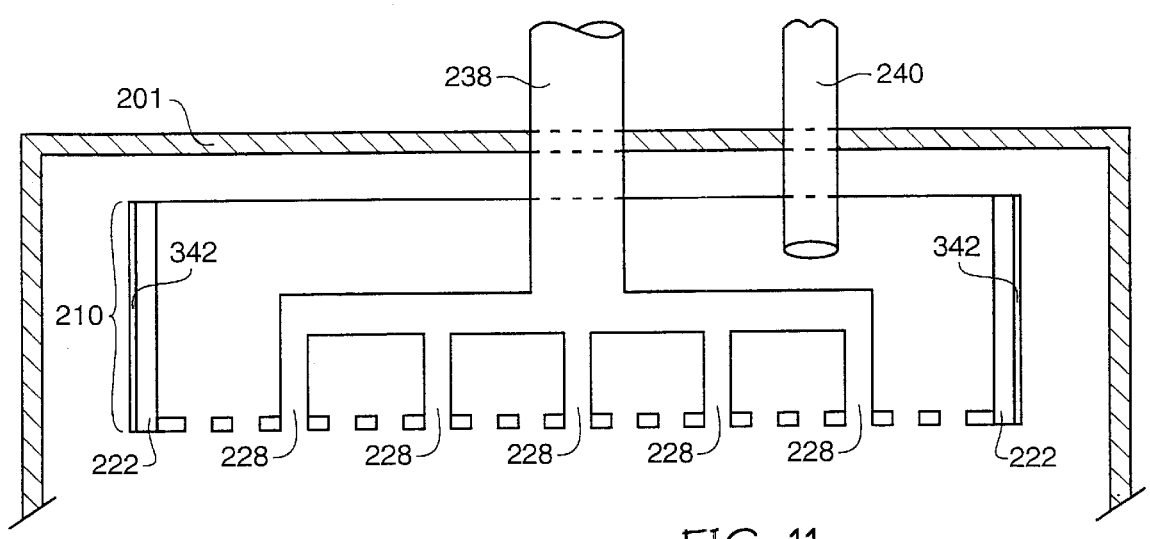
FIG. 11 depicts a cross-sectional view of an eleventh exemplary embodiment of the current invention.
Figure 12:
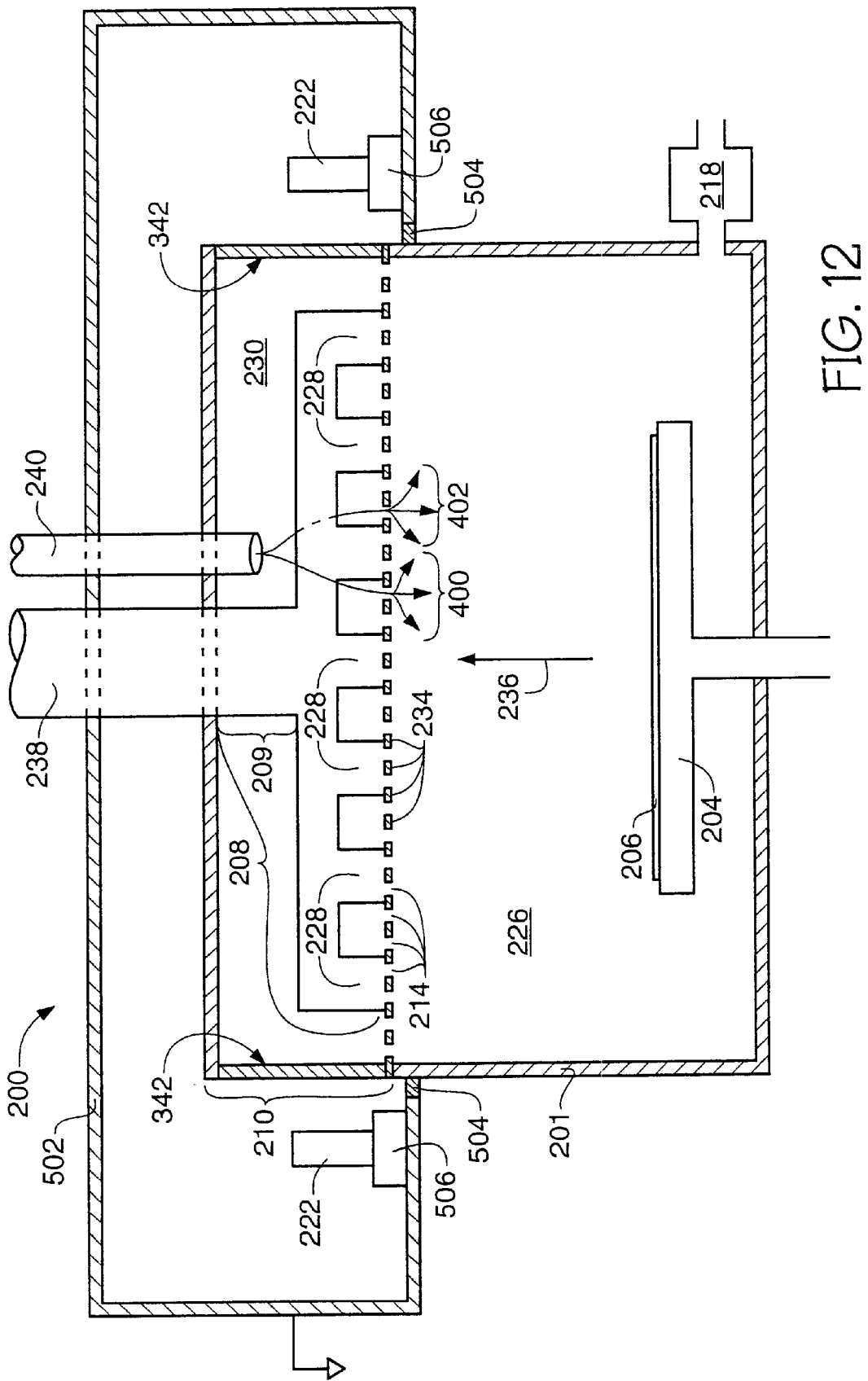
FIG. 12 depicts a cross-sectional view of a twelfth exemplary embodiment of the current invention.

As seen in FIG. 9, a heating element 222 can be coupled to the gas conduit 208 and used to ionize at least the first gas within the gas conduit 208. One basic example of a heating element is a metal filament capable of generating heat when electricity passes through the filament. Although heating the first gas can occur anywhere in the gas conduit 208, it is once again preferable to ionize the gas right before it exits the showerhead 210. Thus, in FIG. 10, heating elements 222 are attached to the sub-conduits 228. As yet another alternative pictured in FIG. 11, a heating element 222 internal to the perimeter 342 of the showerhead 210 could be used to ionize one or all of the gasses. In the embodiments depicted in FIGS. 8, 9, 10, and 11, it is noteworthy that the ionizing elements are internal to the showerhead 210. As a result, it is not necessary to configure a showerhead 210 with walls 342 external to the housing 201. Rather, the showerhead 210 may be enclosed within the housing 201, where it defines an inner portion of the chamber 226. It follows that the outer portion of chamber 226 is then defined as the area outside of the showerhead 210 yet within the housing 201. Nevertheless, the heating element 222 could be completely external to the showerhead 210, as seen in FIG. 12. However, ionizing the gasses using a heat source is not the most preferred of embodiments, as it requires a great deal of heat to ionize gasses. Hydrogen, for example, generally does not ionize at temperatures below 1000° C.

Figure 13A:
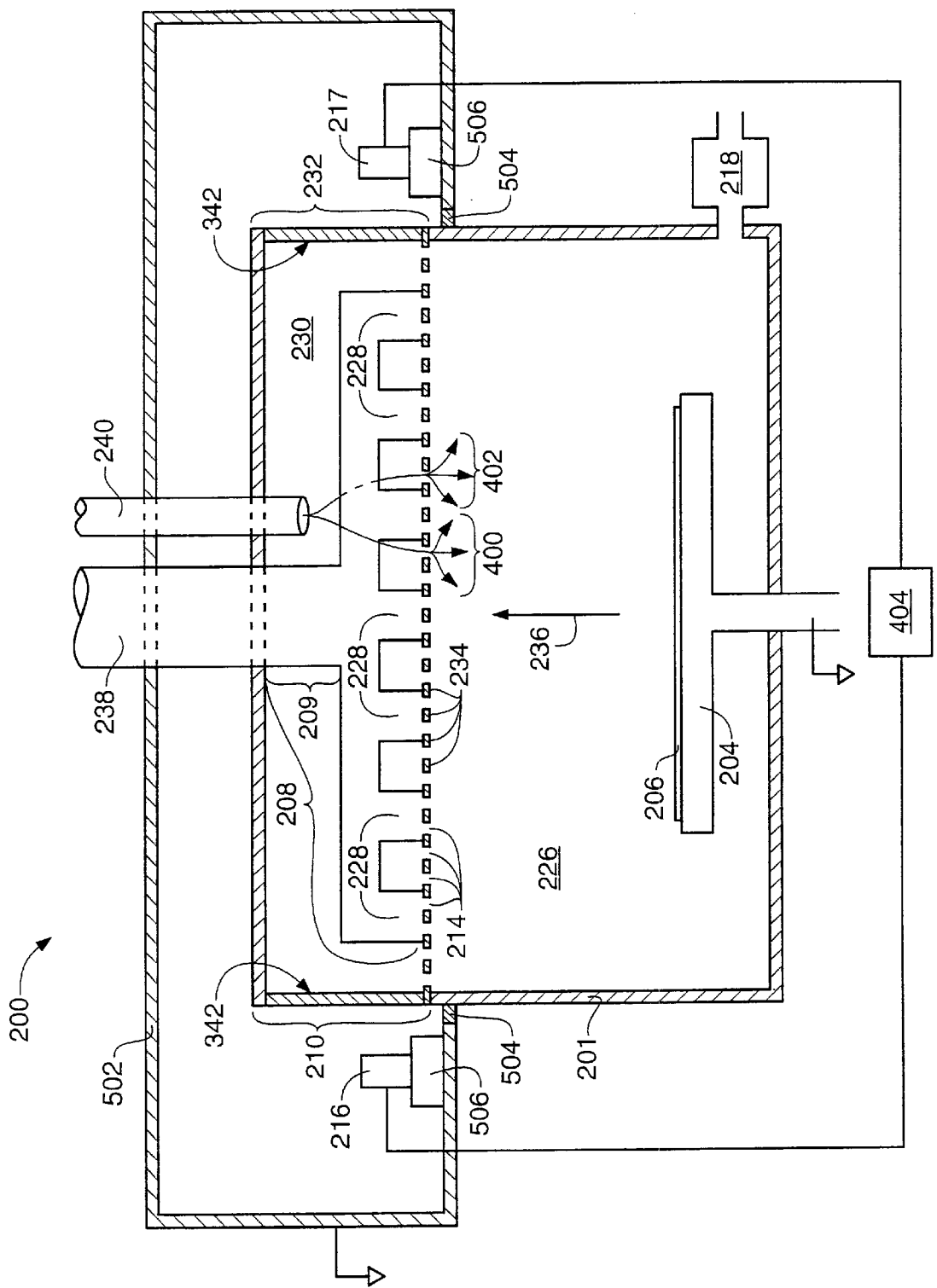
FIG. 13A depicts a cross-sectional view of a thirteenth exemplary embodiment of the current invention.
Figure 13B:
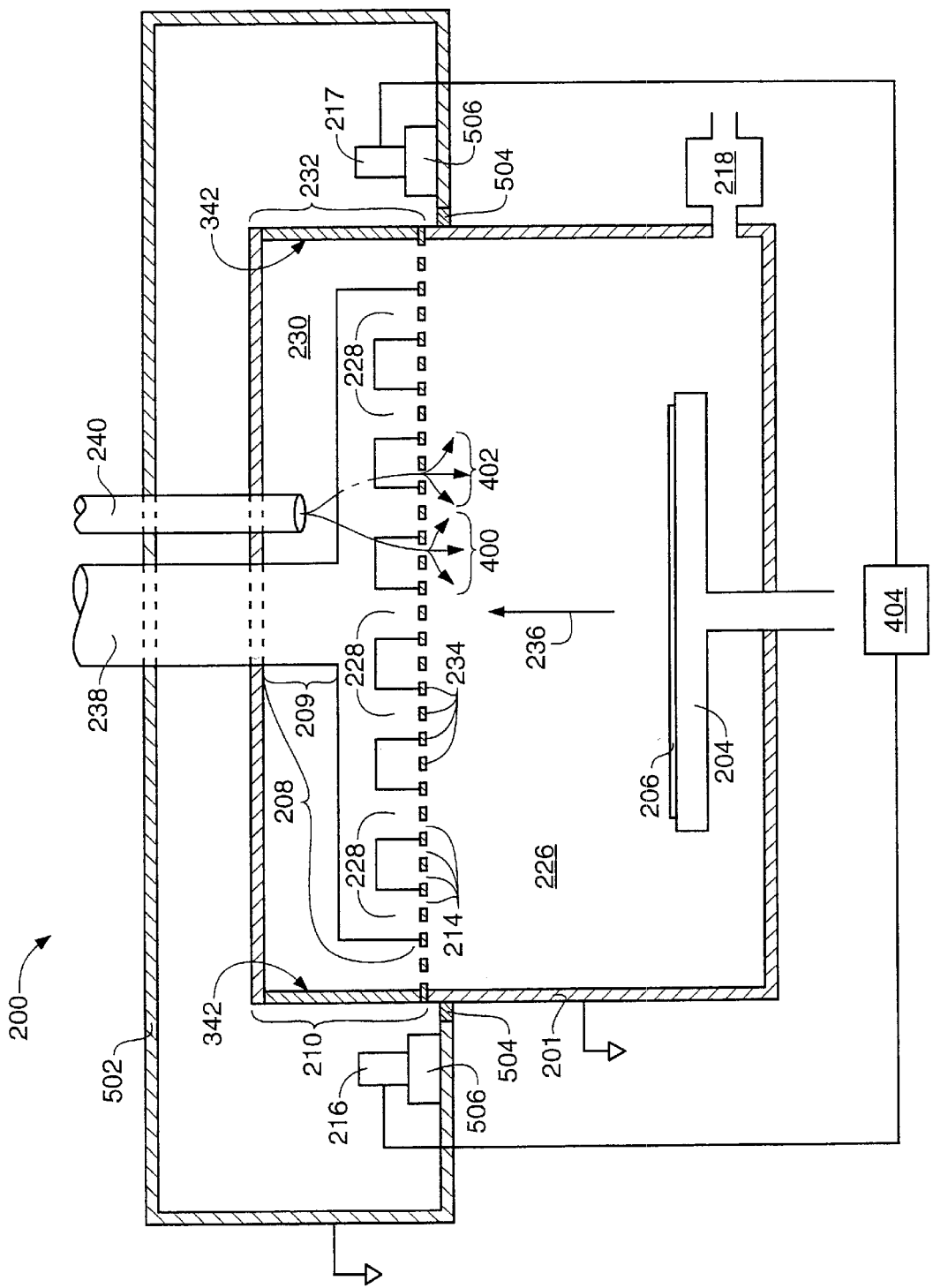
FIG. 13B depicts a cross-sectional view of a fourteenth exemplary embodiment of the current invention.
Figure 14:
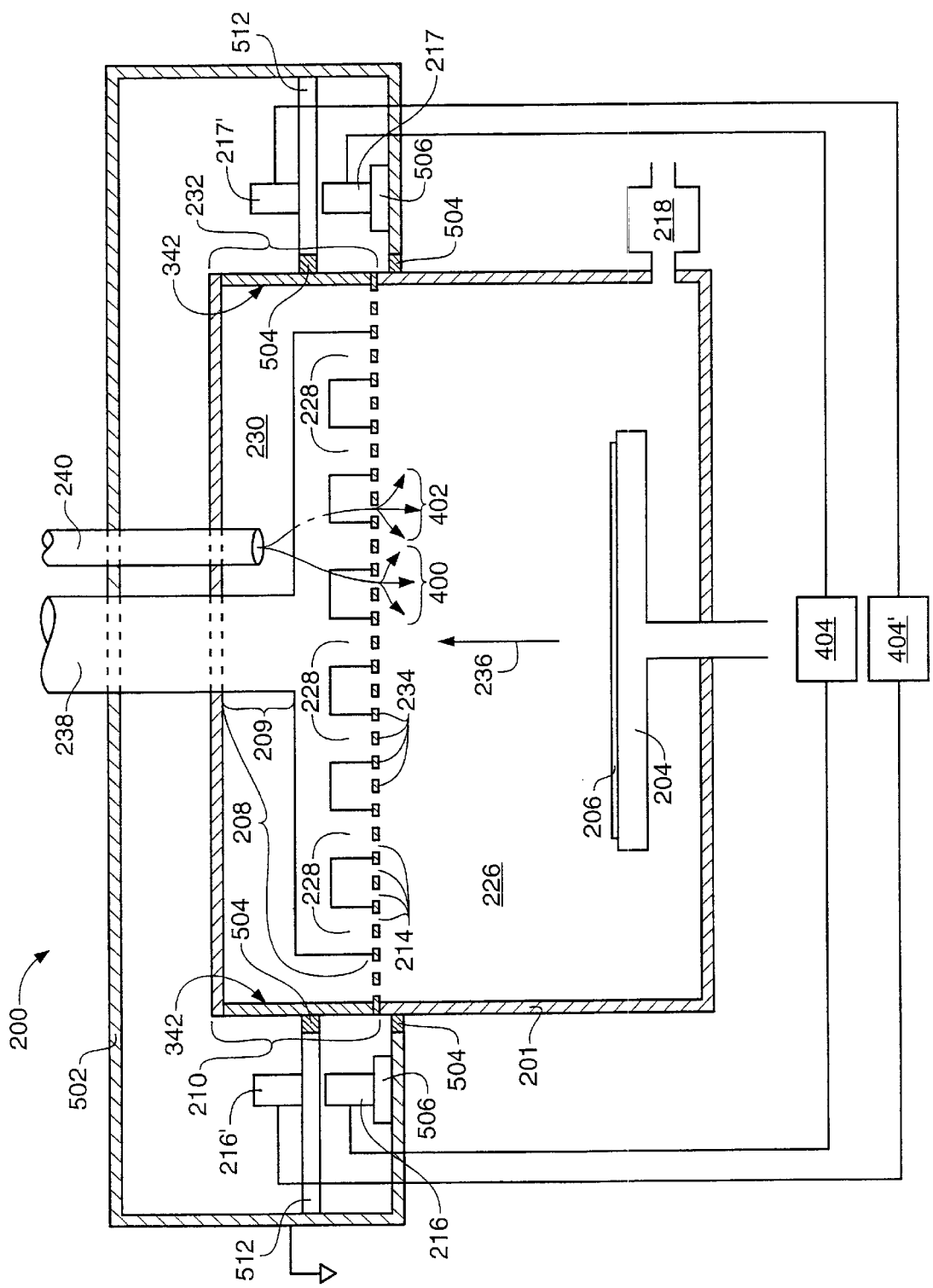
FIG. 14 depicts a cross-sectional view of a fifteenth exemplary embodiment of the current invention.
Figure 15:
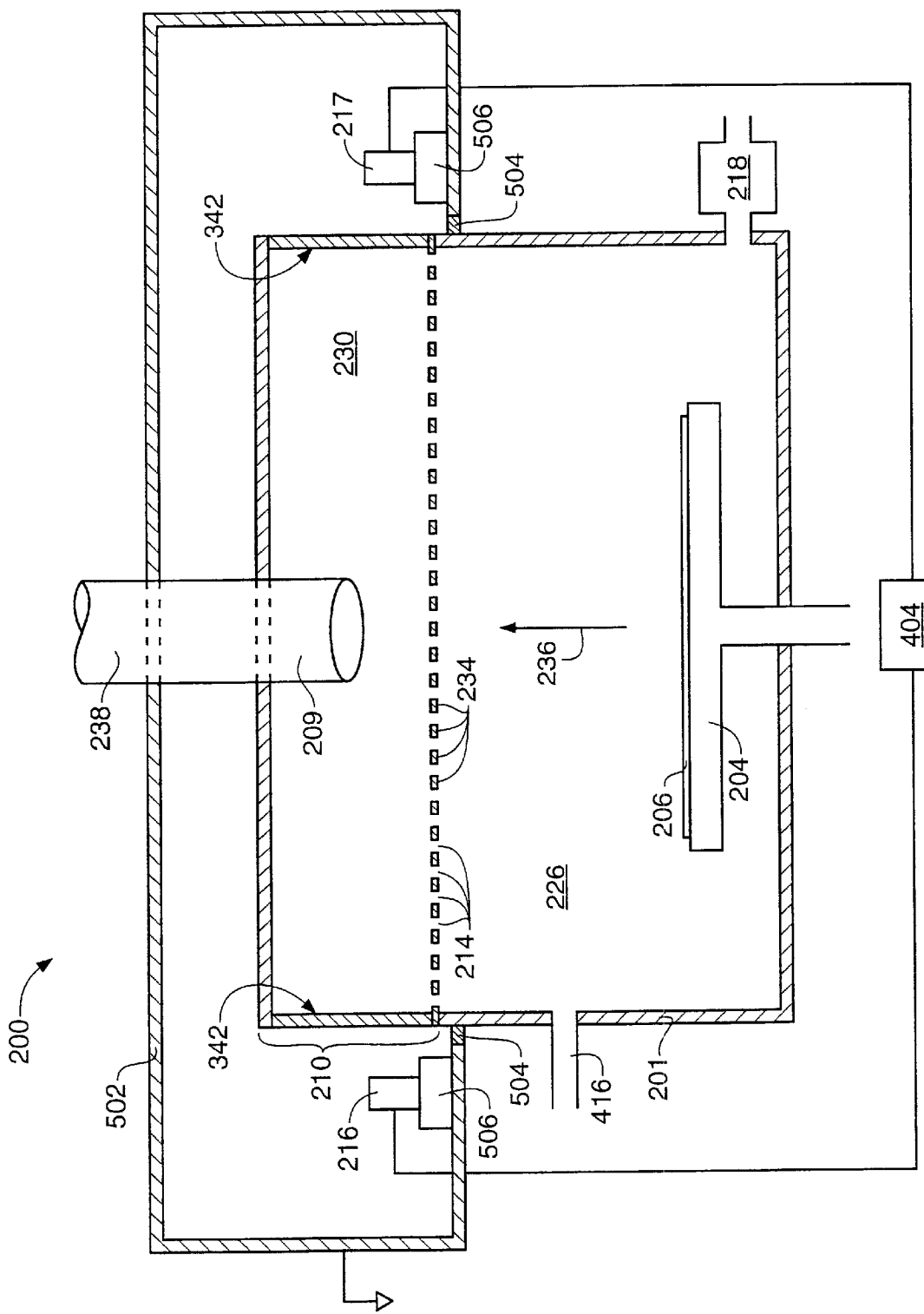
FIG. 15 depicts a cross-sectional view of a sixteenth exemplary embodiment of the current invention.

One skilled in the art can appreciate that, although specific embodiments of this invention have been described above for purposes of illustration, various modifications may be made without departing from the spirit and scope of the invention. For example, the apparatus could be operated with the susceptor grounded, as seen in FIG. 13A. Alternatively, the entire apparatus could be grounded, as depicted in FIG. 13B. As another example shown in FIG. 14, multiple pairs of electrodes 216 & 217 and 216' & 217', wherein each pair is coupled to a different type of power source 404 and 404', could be used to ionize gasses within the showerhead 210. As in FIG. 5B, a divider 512 can be used to support and isolate the pairs of electrodes. If necessary, this divider 512 can be made of an insulating material and could extend from the casing 502 all the way to the showerhead 210. Moreover, it is not necessary to have all gasses enter through one showerhead. As seen in FIG. 15, only gasses to be ionized enter through the showerhead 210, whereas other gasses are introduced through a second entrance 416. This eliminates the need for a partition structure within showerhead 210.

Figure 16:
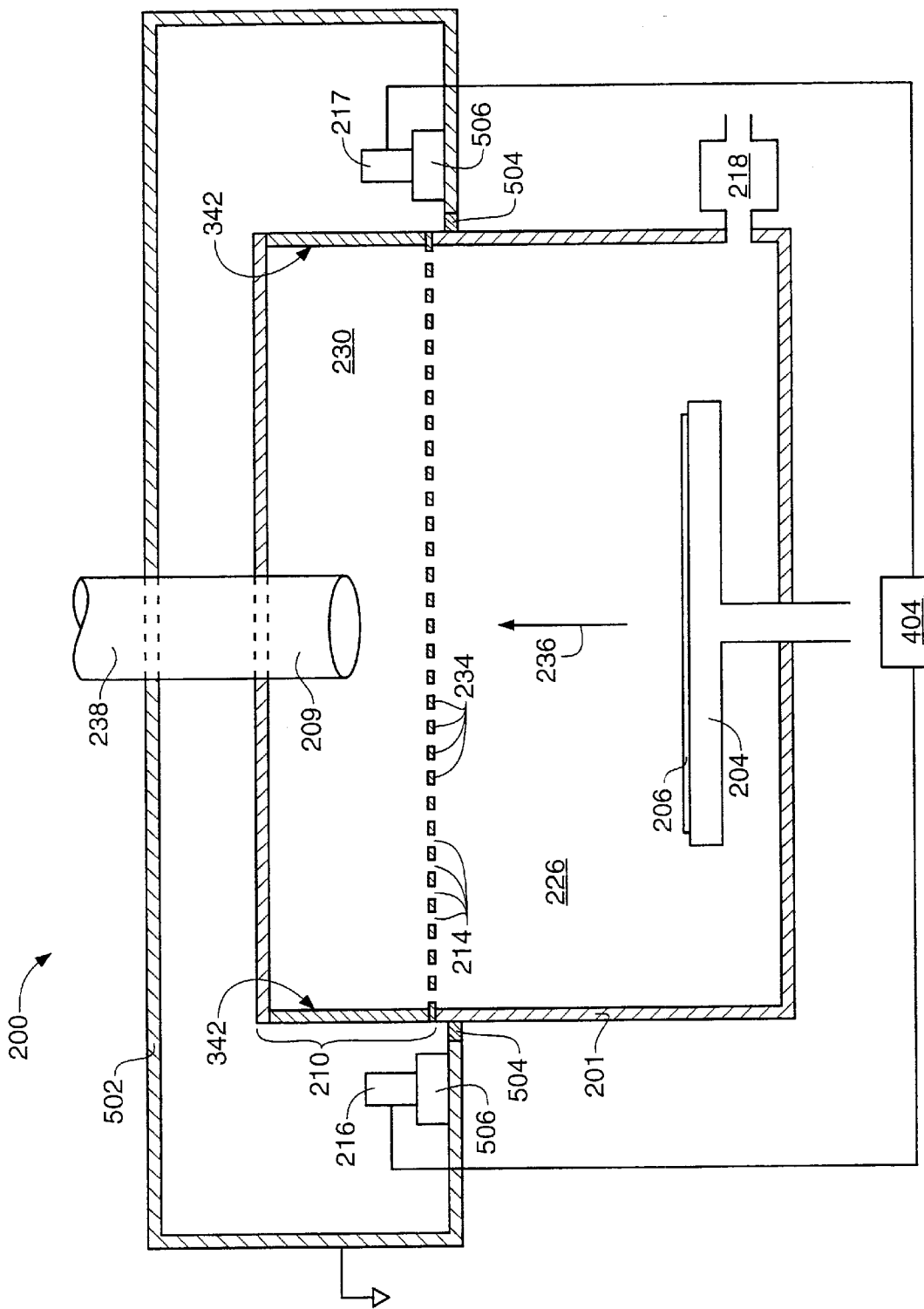
FIG. 16 depicts a cross-sectional view of a seventeenth exemplary embodiment of the current invention.

In addition, objects other than a wafer could be processed. Such an object could be flexible or non-flexible. Further, the object could be made of an organic material or inorganic material. Moreover, the substrate could have any shape, such as a foam, a film, a rod, a tube, or some irregular shape. In addition, the plasma process carried out by the current invention is not limited to CVD. The method and apparatus comprising the current invention can be used for etching, such as reactive ion etching; dry development of exposed and silylated photoresist layers; annealing; planarizing; inter-level dielectric formation; biased sputtering; epitaxial semiconductor growth processing; and cleaning. As an example of the cleaning process using the apparatus depicted in FIG. 16, Ar and $H_2$ are passed through the showerhead 210, wherein they encounter a plasma-generating field created by electrodes 216 and 217. A metastable species of Ar results, which aids in dissociating the molecular hydrogen. The resulting atomic hydrogen exits the showerhead 210 and reaches the surface of the wafer 206. Once there, the atomic hydrogen reacts with unwanted residue on the wafer 206 to form volatile compounds which leave the surface of the wafer 206 and are removed by pump 218. Typical operating conditions for this process are 200 sccm of Ar; 50 sccm of $H_2$; 100 mTorr of pressure; an ionization power of 50 W; a 300° C. wafer surface temperature; and a thirty second process duration. Nevertheless, parameters may vary, as indicated in U.S. Pat. No. 5,180,435. It should be further noted that in the embodiment depicted in FIG. 16, there is no need to keep components of gasses separated until the gasses are outside of the showerhead 210. This eliminates the need for partitioning within the showerhead 210 as well as the need for a second entrance for another gas.

Finally, although the location of plasma generation in the present invention has been termed "quasi-remote," indicating that plasma is not being generated immediately above the wafer, it should be noted that the term "quasi-local" could be equally applicable in that plasma is still being generated within the process chamber. Accordingly, the invention is not limited except as stated in the claims.

What is claimed is:

1. A plasma-process showerhead, comprising:
   a body configured to receive energy from a power source;
   a plate coupled to said body, said plate having a first group of apertures and a second group of apertures, and said plate and said body defining a plasma-creation zone within said body; and
   a first-gas conduit located within said body and coupled to said body and to said plate, said first-gas conduit configured to intersect said plasma-creation zone and further configured to end at said first group of apertures.

2. The plasma-process showerhead in claim 1, herein said body and said first-gas conduit are cooperatively configured to define a second-gas passageway leading to said second group of apertures.

3. The plasma-process showerhead in claim 2, wherein said first-gas conduit is configured to branch into a plurality of sub-conduits; and wherein said plurality of subconduits end at said first group of apertures.

4. The plasma-process showerhead in claim 3, wherein. each sub-conduit of said plurality of sub-conduits ends at at least one aperture of said first group of apertures.

5. The plasma-process showerhead in claim 4, wherein said body is positioned to receive a first ionization energy.

6. The plasma-process showerhead in claim 5, wherein said body is positioned to receive a second ionization energy.

7. A CVD system, comprising:
   a housing;
   a showerhead, further comprising:
      a body defining an interior volume and having a face perforated by a first group of apertures and a second group of apertures, wherein said body is coupled to said housing;
      a conduit extending through said volume and communicating with said first group of apertures;
   a first pair of ionization electrodes around said showerhead.

8. The CVD system in claim 7, wherein a portion of said interior volume that is external to said conduit is in communication with said second group of apertures.

9. The CVD system in claim 8, further comprising a second pair of ionization electrodes around said showerhead.

10. A showerhead for a plasma-process system defining a reaction chamber, comprising:
    a conduit system; and
    a shell coupled to said conduit system and generally encompassing said conduit system, wherein said shell is configured to couple to said plasma-process system within said reaction chamber; and
    a plasma enabling device configured to enable ionization, wherein said plasma enabling device is positioned in relation to said shell such that said ionization is limited to within said shell.

11. The showerhead in claim 10, wherein said shell is configured to couple to a first gas supply pipe of said plasma-process system.

12. The showerhead in claim 11, wherein said shell is configured to couple to a second gas supply pipe of said plasma-process system, and said shell is further configured to accommodate a gas from said second gas supply pipe between an exterior of said conduit system and an interior of said shell.

13. The showerhead in claim 12, wherein said shell intersects a plane defined by said plasma-enabling device.

14. The showerhead in claim 12, wherein said shell is within a perimeter defined by said plasma-enabling device.

15. The showerhead in claim 12, further comprising an additional conduit system coupled to said shell and encompassed by said shell.

16. The showerhead in claim 15, wherein said shell is configured to couple to a third gas supply pipe of said plasma-process system, and said shell is further configured to accommodate a gas from said third gas supply pipe between said conduit system, said additional conduit system, and said shell.

17. A plasma reactor, comprising:
a reactor housing;
a workpiece supporter coupled to said reactor housing and located to avoid an ionization field; and
a gas disperser coupled to said reactor housing, said gas disperser comprising:
a gas housing located to intercept [an] said ionization field,
at least one partition located within said gas housing, said gas housing being configured to receive at least one gas on one side of said partition and at least a second gas on a second side of said partition, and
a perforated dispersal plate located at a side of said gas housing and in communication with an interior of said gas housing on both sides of said partition.

18. A plasma reactor, comprising:
a reactor housing; and
a gas disperser coupled to said reactor housing, said gas disperser comprising:
a gas housing located to intercept an ionization field,
at least one partition located within said gas housing, said gas housing being configured to receive at least one gas on one side of said partition and at least a second gas on a second side of said partition, and
a perforated dispersal plate located at a side of said gas housing and in communication with an interior of said gas housing on both sides of said partition, wherein said dispersal plate is positioned along a boundary defined by said ionization field.

19. A plasma reactor, comprising:
a reactor housing; and
a gas disperser coupled to said reactor housing, said gas disperser comprising:
a gas housing located to intercept an ionization field,
at least one partition located within said gas housing, said gas housing being configured to receive at least one gas on one side of said partition and at least a second gas on a second side of said partition, and
a perforated dispersal plate located at a side of said gas housing and in communication with an interior of said gas housing on both sides of said partition, wherein said dispersal plate is positioned outside a boundary defined by said ionization field.

20. A plasma reactor, comprising:
a reactor housing;
a gas disperser coupled to said reactor housing, said gas disperser comprising:
a gas housing located to intercept an ionization field,
at least one partition located within said gas housing, said gas, housing being configured to receive at least one gas on one side of said partition and at least a second gas on a second side of said partition, and
a perforated dispersal plate located at a side of said gas housing and in communication with an interior of said gas housing on both sides of said partition; and
a susceptor coupled to said reactor housing and cooperatively positioned in relation to said gas disperser; and
wherein said gas housing is configured to intercept said ionization field to the exclusion of an area between said dispersal plate and said susceptor.

21. A CVD reactor showerhead, comprising:
a body having an interior volume and having a porous wall;
a conduit extending through said interior volume to said porous wall, wherein an interior of said conduit is isolated from said interior volume exterior to said conduit, and wherein said interior volume exterior to said conduit defines a passageway; and
a heater coupled to said conduit and located within the interior volume of the body, said heater having thermal communication with said passageway.

22. The showerhead in claim 21, wherein said conduit further comprises:
a main trunk coupled to said body; and
a plurality of branches, wherein each branch of said plurality of branches is coupled to said main trunk at one end and to said porous wall at another end.

23. The showerhead in claim 22, wherein said heater is coupled to said main trunk.

24. The showerhead in claim 22, further comprising a plurality of heaters, wherein each heater of said plurality of heaters is respectively coupled to one branch of said plurality of branches.

25. A plasma reactor, comprising:
a housing;
a showerhead coupled to said housing, further comprising:
a body defining a shell including a porous region;
a plurality of gas conduits extending through said shell to said porous region; and
at least one ionization electrode pair external to and level with said showerhead and configured to inductively communicate with at least one gas conduit of said plurality of gas conduits.

26. The plasma reactor in claim 25, further comprising a plurality of ionization electrode pairs level With said showerhead and configured to correspondingly inductively communicate with said plurality of gas conduits.

27. The plasma reactor in claim 26, wherein interior portion of said body and exterior portions of said plurality of gas conduits are configured to define a passageway through said shell to said porous region.

28. The plasma reactor in claim 27, further comprising an additional ionization electrode pair level with said showerhead and configured to inductively communicate with said passageway.

29. A plasma processor, comprising:
a housing;
a showerhead coupled to said housing;
a conduit system within said showerhead; and
a first pair of ionizing electrodes flanking said showerhead and configured to couple to a first power source of a first type.

30. The plasma processor in claim 29, wherein a combination of said housing and said showerhead define a chamber.

31. A plasma processor, comprising:
a housing;
a showerhead coupled to said housing, wherein a combination of said housing and said showerhead define a chamber;.
a first pair of ionizing electrodes flanking said showerhead and configured to couple to a first power source of a first type; and a casing coupled to a selection of said showerhead and said housing, wherein said casing supports said first pair of ionizing electrodes.

32. The plasma processor in claim 31, wherein said casing further comprises a contact portion coupled to said showerhead; and wherein said contact portion is made of an insulating material.

33. The plasma processor in claim 32, wherein said casing further comprises a first support portion made of an insulating material and coupled to said first pair of ionizing electrodes.

34. The plasma processor in claim 33, further comprising a second pair of ionizing electrodes flanking said showerhead and configured to couple to a second power source of said first type.

35. The plasma processor in claim 34, wherein said first pair of ionizing electrodes are configured to couple to a first RF power source and further configured to generate a first RF field having a first frequency; and wherein said second pair of ionizing electrodes are configured to couple to a second RF power source and further configured to generate a second RF field having a second frequency.

36. The plasma processor in claim 35, wherein said casing further comprises a divider made of an insulating material and interposed between said first pair of ionizing electrodes and said second pair of ionizing electrodes.

37. The plasma processor in claim 35, wherein said divider supports said second pair of ionizing electrodes.

38. A plasma deposition device, comprising:
a housing having a housing perimeter;
a showerhead coupled to said housing and having a showerhead perimeter and a partitioned showerhead interior;
a first electrode next to said showerhead perimeter and configured to couple to a first power source of a first type; and
a second electrode next to said showerhead perimeter and across said showerhead from said first electrode and configured to couple to said first power source.

39. The plasma deposition device in claim 38, further comprising:
a third electrode next to said showerhead perimeter and configured to couple to a second power source of a second type; and
a fourth electrode next to said showerhead perimeter and across said showerhead from said third electrode and configured to couple to said second power source.

40. The plasma deposition device in claim 39, wherein said first electrode and said second electrode are configured to couple to an RF power source; and said third electrode and said fourth electrode are configured to couple to a microwave power source.

41. The plasma deposition device in claim 40, wherein said showerhead perimeter is generally similar in size to said housing perimeter.

42. A CVD reactor, comprising:
a housing defining a CVD chamber and comprising:
a bottom, and
a sidewall, further comprising:
a lower portion coupled to said bottom, and
a top;
a showerhead shell coupled to said housing and including a porous faceplate defining a plane above said top and generally parallel to said bottom; and
a plurality of ionizing electrodes outside of and next to said showerhead shell and over said top of said sidewall.

43. The CVD reactor in claim 42, wherein said plurality of ionizing electrodes each have a bottom portion above said plane.

44. A CVD reactor, comprising:
housing having:
a bottom, and
a sidewall, further comprising:
a lower portion coupled to said bottom, and
a top;
a showerhead shell coupled to said housing and including a porous faceplate defining a plane above said top and generally parallel to said bottom; and
a plurality of ionizing electrodes next to said showerhead shell and over said top of said sidewall, and wherein said plurality of ionizing electrodes each have a bottom portion coplanar with said plane.

45. The CVD reactor in claims 42, wherein said plurality of ionizing electrodes are internal to said showerhead shell.

46. A plasma processing apparatus, comprising:
a showerhead defining a first portion of a chamber and defining a plurality of process material inputs and configured to allow a gas-ionizing field within said first portion;
a housing defining a second portion of said chamber; and
a plurality of electrodes configured to establish said gas-ionizing field.

47. The plasma processing apparatus of claim 46, wherein said showerhead defines an upper portion of said chamber; and said housing defines a lower portion of said chamber.

48. A plasma processing apparatus, comprising:
a showerhead defining an inner portion of a chamber;
a housing defining an outer portion of said chamber; and
a plurality of electrodes configured in cooperation with said showerhead to establish a gas-ionizing field within said inner portion.

* * * * *

UNITED STATES PATENT AND TRADEMARK OFFICE
CERTIFICATE OF CORRECTION

PATENT NO. : 6,499,425 B1
DATED : December 31, 2002
INVENTOR(S) : Gurtej S. Sandhu It is certified that error appears in the above-identified patent and that said Letters Patent is hereby corrected as shown below:

Column 10,
Line 5, replace "herein said" with -- wherein said --

Column 11,
Line 12, replace "intercept [an] said ionization" with -- intercept said ionization --

Column 12,
Line 38, replace "level With said" with -- level with said --
Line 41, replace "wherein interior" with -- wherein an interior --

Signed and Sealed this

Twenty-third Day of March, 2004

JON W. DUDAS
*Acting Director of the United States Patent and Trademark Office*